(12) United States Patent
Mordkovich

(10) Patent No.: US 6,911,812 B2
(45) Date of Patent: Jun. 28, 2005

(54) METHOD AND APPARATUS FOR MEASURING FREQUENCY PULLING IN OSCILLATORS

(75) Inventor: Mikhail Mordkovich, Brooklyn, NY (US)

(73) Assignee: Scientific Instruments, Inc., Brooklyn, NY (US)

( * ) Notice: Subject to any disclaimer, the term of this patent is extended or adjusted under 35 U.S.C. 154(b) by 0 days.

(21) Appl. No.: 10/395,934

(22) Filed: Mar. 25, 2003

(65) Prior Publication Data
US 2004/0000921 A1 Jan. 1, 2004

Related U.S. Application Data
(60) Provisional application No. 60/391,880, filed on Jun. 28, 2002.

(51) Int. Cl.[7] .................. G01R 23/16; G01R 31/08; G01R 35/00
(52) U.S. Cl. .................. 324/76.22; 324/76.19; 324/520; 324/601; 324/602; 324/622
(58) Field of Search .................. 324/76.22, 76.39, 324/76.19, 76.26, 76.41, 520, 601, 602, 622

(56) References Cited

U.S. PATENT DOCUMENTS 6,639,393 B2 * 10/2003 Tasker et al. ............ 324/76.19
6,650,186 B1 * 11/2003 Sommer et al. ............... 331/11

* cited by examiner

Primary Examiner—N. Le
Assistant Examiner—John Teresinski
(74) Attorney, Agent, or Firm—Kevin Redmond

(57) ABSTRACT

A test apparatus and method of measuring pulling of the frequency of an oscillator. The apparatus includes a bias tee, a power supply, a spectrum analyzer, a second power supply, a symmetrical resistive power splitter, a power meter and a synthesized signal generator. The method includes sweeping the synthesized signal generator frequency from the nominal frequency down to a first frequency. The first frequency is recorded when the oscillator goes out of frequency lock as a first pulling frequency. The synthesized signal generator frequency is then sweet from the nominal frequency up to a second frequency and the second pulling frequency is recorded when the oscillator goes out of frequency lock. The difference between the first and second pulling frequencies is the peak to peak pulling value.

6 Claims, 4 Drawing Sheets

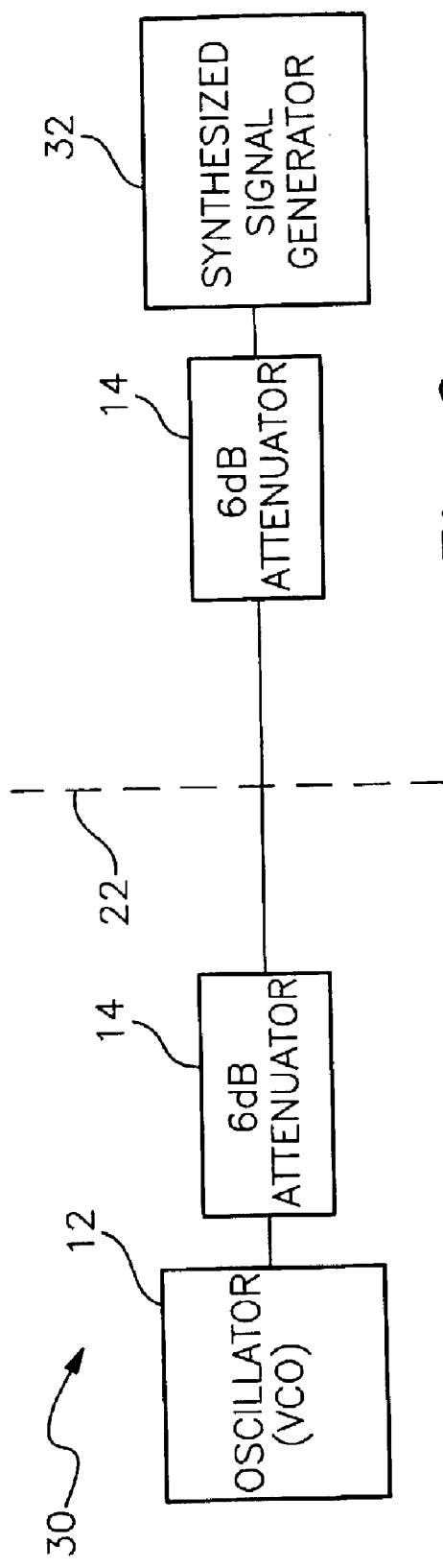
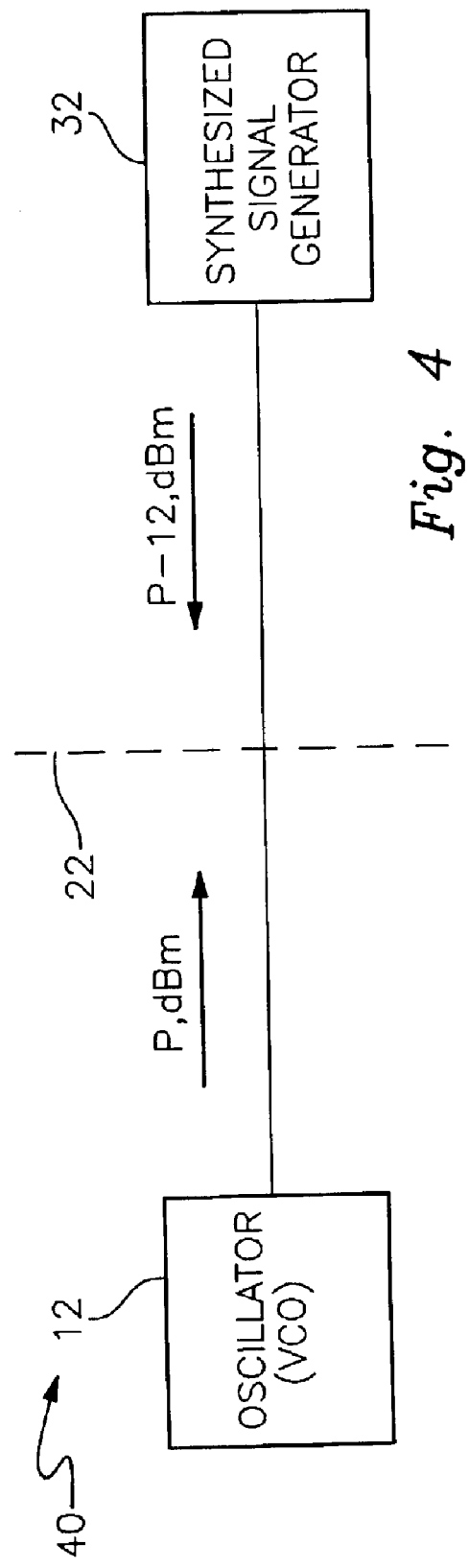

METHOD AND APPARATUS FOR MEASURING FREQUENCY PULLING IN OSCILLATORS

BACKGROUND

This application claims the benefit of provisional application No. 60/391,880, filed Jun. 28, 2002.

FIELD OF THE INVENTION

This invention relates to oscillators in general and more particularly to a method of measuring pulling of the carrier frequency of an oscillator.

DESCRIPTION OF RELATED ART

The nominal carrier frequency of an oscillator is specified at a nominal RF load of 50 ohms. If the RF load has an impedance mismatch, part of the incident RF signal reflects back to the oscillator. At a moment of reaching the oscillator, the reflected RF signal has some phase shift that depends on the total electrical length between the oscillator and the mismatched RF load. This results in pulling of the carrier frequency of the oscillator away from the nominal frequency. Different applications may have different magnitude and phase of a reflected RF signal. Therefore, a standard mismatch of 12 dB return loss with the ability to continuously vary the reflection phase by more than 360 degrees was chosen to compare the frequency pulling of different oscillators under equal conditions.

FIG. 1 shows a prior art test setup 10 and method of pulling measurement. A conventional oscillator 12 such as a voltage controlled oscillator (VCO) is connected through a 6 dB attenuator 14 to a reflective phase shifter 16. The traditional or prior art method of pulling measurements is based on using a reflective phase shifter that can be mechanical such as a variable length airline or electronic based. The signal from the oscillator or voltage controlled oscillator 12 is normally reflected from the 12 dB return loss load with a variable phase of reflection. The reflected signal feeds back to the oscillator and pulls the frequency of the oscillator from its nominal value.

The objective of the measurement is to find the maximum frequency variations as a result of the reflection phase variation or peak to peak pulling value. The phase of the RF signal is continuously changed by the variable phase shifter 16. As a result, the carrier frequency of the oscillator changes also. The difference between the maximum and the minimum in the carrier frequency of the oscillator gives the pulling peak to peak value. The apparatus of FIG. 1 is only able to cover a narrow frequency range and is difficult to use in a high speed production environment.

While various methods of pulling measurements have been used, they have suffered from not having good accuracy, only covering a narrow carrier frequency range, being complex to build and difficult to automate.

A current unmet need exists for a method of pulling measurement that is accurate, covers a wide carrier frequency range, is easy to build and can be readily automated in high volume production.

SUMMARY

It is a feature of the invention to provide a method of measuring pulling of the carrier frequency of an oscillator.

Another feature of the invention is to provide a test apparatus for performing a frequency pulling measurement on an oscillator. The test apparatus includes a bias tee having a RF terminal, a DC terminal and an output terminal. A power supply is connected to the DC terminal. A spectrum analyzer is connected to the RF terminal. An oscillator has a tuning voltage terminal, an RF output terminal and a supply voltage terminal. Another power supply is connected to the tuning voltage terminal. A symmetrical resistive power splitter has a first, second and third terminal. The RF output terminal is connected to the third terminal. A power meter is connected to the first terminal. A synthesized signal generator is connected to the second terminal.

An additional feature of the invention is to provide a test apparatus for performing a frequency pulling measurement on an oscillator. The test apparatus includes a symmetrical resistive power splitter that has a first, second and third terminal. An oscillator has a tuning voltage terminal, a RF output terminal and a supply voltage terminal. The RF output terminal is connected to the first terminal. A voltage controlled oscillator and phase locked loop analyzer (VCO/PLL) have a control voltage terminal, an RF input terminal and a power terminal. The control voltage terminal is connected to the tuning voltage terminal. The power terminal is connected to the supply voltage terminal and the RF input terminal is connected to the second terminal. A synthesized signal generator is connected to the third terminal.

Another feature of the invention is to provide a method of performing a frequency pulling measurement. The method includes providing a bias tee having an RF terminal, a DC terminal and an output terminal. A first power supply is connected to the DC terminal and a spectrum analyzer is connected to the RF terminal. An oscillator has a tuning voltage terminal, a RF output terminal and a supply voltage terminal. A second power supply is connected to the tuning voltage terminal. A symmetrical resistive power splitter has a first, second and third terminal. The RF output terminal is connected to the third terminal. A power meter is connected to the first terminal and a synthesized signal generator is connected to the second terminal. The first and second power supply voltages are set. The RF power at the power meter is measured. The synthesized signal generator power level is set to a first level. The synthesized signal generator frequency is set to the nominal oscillator frequency under test. The spectrum analyzer frequency range is set to a first range. The synthesized signal generator frequency is swept from the nominal frequency down to a first frequency. A signal above a first noise level is detected that is indicative of the oscillator under test going out of frequency lock. The frequency of the synthesized signal generator is recorded as a first pulling frequency. Then the synthesized signal generator frequency is swept from the nominal frequency up to a second frequency. When a signal above a pre-determined noise level is detected. It is indicative of the oscillator under test going out of lock again. The frequency of the synthesized signal generator is recorded as a second pulling frequency. The difference between the first and second pulling frequencies when the oscillator goes out of frequency lock is the peak to peak pulling value.

BRIEF DESCRIPTION OF THE DRAWINGS

FIG. 3 is a diagram of a symmetrical measurement system.

FIG. 4 is another diagram of a symmetrical measurement system.

It is noted that the drawings of the invention are not to scale. In the drawings, like numbering represents like elements between the drawings.

DETAILED DESCRIPTION

Figure 1:
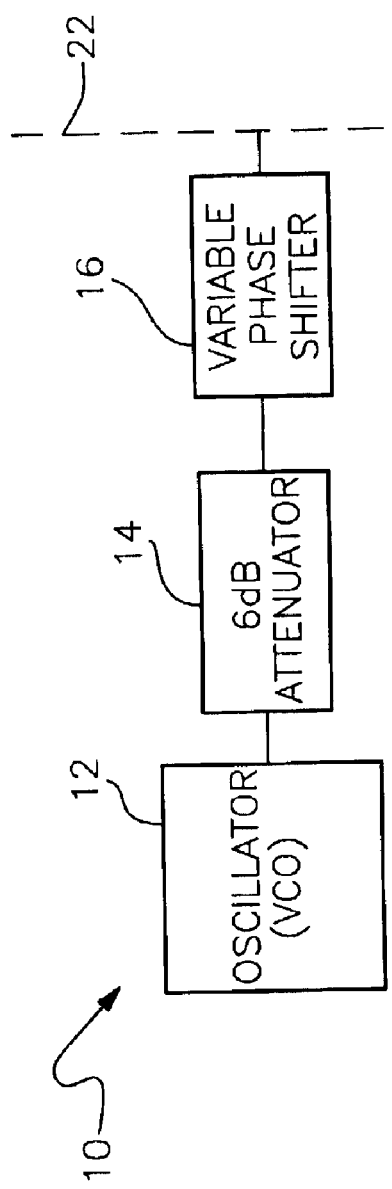
FIG. 1 is a diagram of a prior art pulling measurement method.

In FIG. 1, the signal from the oscillator 12 goes through a 6 dB attenuator 14, the variable phase shifter 16 and mirroring back to the oscillator 12 (in reverse order). The ideal full reflection mirror plane 22 can be substituted with the mirror image of what is located to the left side from the mirror or the dash line of FIG. 1.

Figure 2:
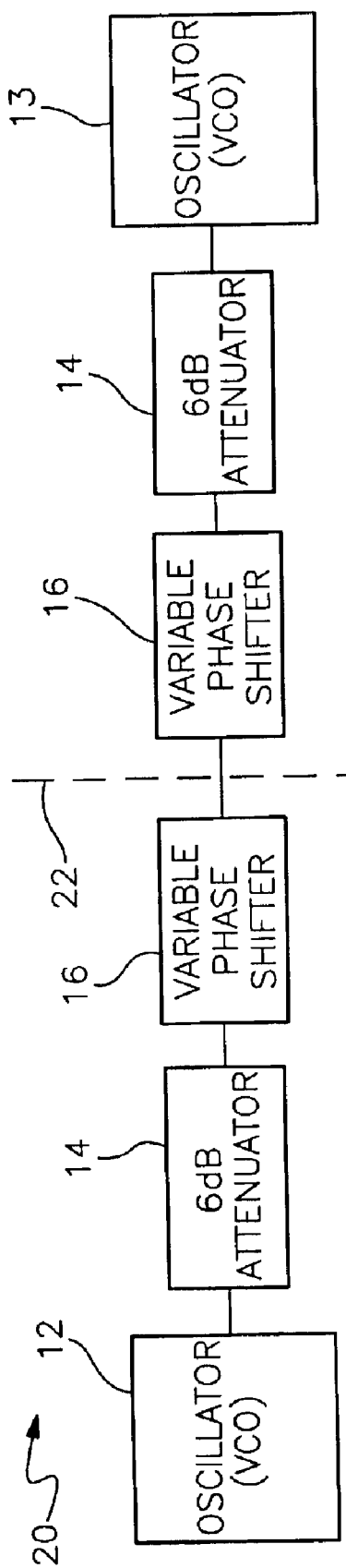
FIG. 2 is a theoretical diagram of a symmetrical measurement system.

Referring to FIG. 2, a theoretical diagram of a symmetrical measurement system 20 is shown. The dash line is an ideal full reflection plane 22. This plane is the plane of an ideal mirror. Oscillators 12 and 13 are identical and are receiving a 12 dB reflected signal from each other.

When the phase of the variable phase shifters 16 is continuously changed, the frequencies of both oscillators are equal. This is because they are mirror images of each other and change their values synchronously within its peak to peak pulling value, while the phase shift varies for more than 360 degrees. The momentary phases of RF output signals of both oscillators are also equal to each other for the same mirror image reason. In other words, both oscillators are coherent over their peak to peak frequency pulling range. Any change in the propagation phase between the oscillators causes the frequency change of both oscillators until their coherent (synchronous) steady state is restored and therefore their frequencies and phases are equal. This is the definition of the phase locked state. The mirror image oscillators 12 and 13 are in injection locked state (to each other) within their peak to peak pulling range.

The phase shifter variation results in the frequency shift of both oscillators. Both oscillators are in the same injection locked state within the peak to peak pulling range for any propagation phase value. If the propagation phase is shifted, this can slightly change the carrier frequency of one of the oscillators. This will eventually shift the phase of the signal injected into the other oscillator because the phase is just an integral of the frequency over time. This phase deviation causes the second oscillator to follow the first oscillator in frequency change until the frequency change is within the injection lock or peak to peak pulling range.

If the propagation phase is fixed, but the frequency of one of the oscillators is forced to be slightly changed, this eventually shifts the phase of the signal injected to the other oscillator. This is because the phase is just an integral of the frequency over time.

The frequency shift between the oscillators integrated over time results in the phase shift that is equivalent to the propagation phase change of the variable phase shifter between the oscillators. The right side oscillator 13 can be replaced with a wide range synthesized signal generator 32 that is set to the same power level as the left side oscillator 12. This is shown in FIG. 3 as a modified symmetrical test system 30. The variable phase shifter 16 can be omitted because the phase incoming to the left side oscillator 12 can be varied by offsetting the carrier frequency of the synthesized signal generator 32. In addition, both attenuators 14 can be omitted, if the synthesized signal generator is set directly a power level 12 dB less than the oscillator under test. This modification is shown in FIG. 4.

The response behavior of test system 40 will be identical to the mirror image oscillator system 20 of FIG. 2. This results in a very simple test set up to measure the peak to peak pulling value by measuring the equivalent injection locking range for the −12 dBc RF signal (referenced to the oscillator under test). If the frequency of the synthesized signal generator is swept from some frequency lower than the expected lowest signal injection lock frequency to some frequency higher than the expected highest signal injection lock frequency, three events occur.

First, oscillator 12 is unlocked from the signal injected into oscillator 12 because the frequency of the injected signal is lower than the lowest lock frequency of the oscillator.

Second, oscillator 12 is locked from the signal injected into the oscillator, because the frequency of the injected signal is within the lock frequency range or peak to peak pulling range of the oscillator.

Third, oscillator 12 is unlocked from the frequency of the signal injected into the oscillator, because the frequency of the injected signal is higher than the highest lock frequency of the oscillator.

The locking of oscillator 12 to the swept injected signal of the synthesized signal generator can be detected and used to measure the lock frequency range of the oscillator. This lock frequency range is equivalent to the pulling peak to peak value.

Figure 5:
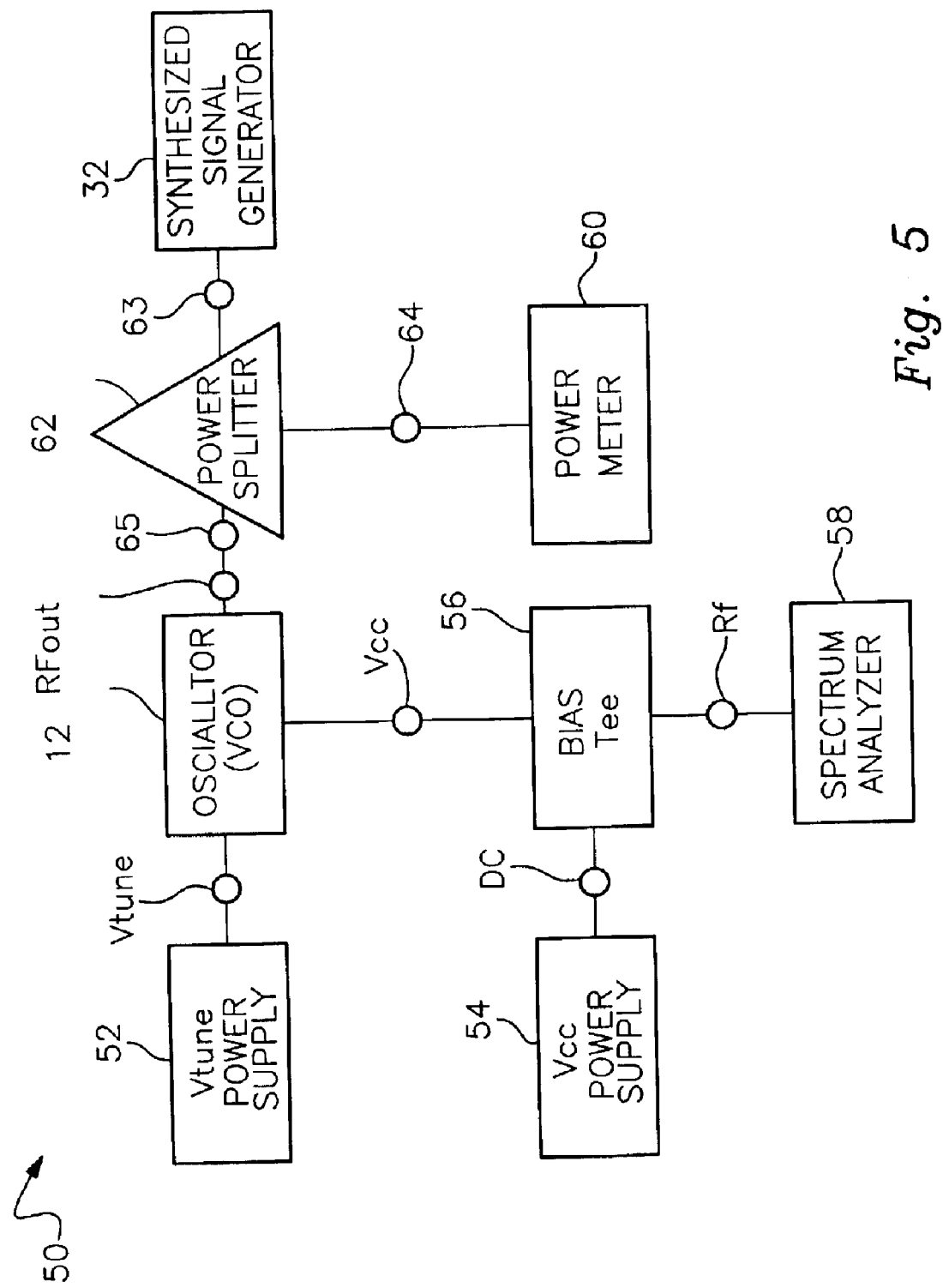
FIG. 5 is a schematic diagram of the preferred test apparatus for a pulling measurement method.

Turning to FIG. 5, a schematic diagram of the preferred test apparatus 50 for a pulling measurement method is shown. Apparatus 50 has a bias tee 56 having a RF terminal RF, a DC terminal DC and an output supply terminal Vcc. A first power supply 54 is connected to the terminal DC. A spectrum analyzer 58 such as an Agilent model HPE4407B is connected to the RF terminal RF. Oscillator 12 has a tuning voltage terminal Vtune, a RF output terminal RF out and a supply voltage terminal Vcc. A second power supply 52 is connected to the tuning voltage terminal Vtune. A symmetrical resistive power splitter 62 has a first 65, second 63 and third 64 terminals. The RF output terminal RF out is connected to terminal 65. A power meter 60 is connected to terminal 64. A synthesized signal generator 32 such as a Hewlett Packard model HP8665B is connected to terminal 63.

The procedure to perform the frequency pulling measurement using the test apparatus 50 of FIG. 5 is detailed in the following steps:

1. The desired Vcc and Vtune voltages are set on power supplies 54 and 52, the synthesized RF power is kept off.

2. The RF power from the oscillator 12 under test, going to the power meter 60, is measured.

3. The oscillator 12 is turned off and the synthesized signal generator 32 is turned on.

4. The synthesized signal generator 32 power level, measured by power meter 60, is set 6 dB less than the power level measured in step 2. This provides a −12 dBc level of synthesized signal at the output of the oscillator under test (RF out).

5. The synthesized signal generator 32 frequency is set to the nominal oscillator frequency under test (Fdut).

6. The spectrum analyzer's 58 frequency range is set to Fstart=100 KHz, Fstop=4(Fpulling), where Fpulling is the expected peak to peak pulling value. If the expected pulling value is not known, it may be set to 10% of the carrier frequency of the oscillator.

7. The oscillator under test 12 is turned off.

8. The frequency of the synthesized signal generator 32 is swept down from Fdut to (Fdut−2(Fpulling)). The frequency step size should be less than the desired accuracy of the pulling measurement.

9. After each frequency step of the synthesized signal generator, the spectrum generator is swept using the peak search function to identify signals above the noise levels, if any are present. If a signal is detected above the noise level, this indicates that the oscillator under test just went out of lock. The frequency readout from the synthesized signal generator will be the minimum peak pulling value.

10. Step 9 is repeated for a sweep frequency up from Fdut to (Fdut+2(Fpulling)). When the oscillator goes out of lock gives the maximum peak to peak pulling value. Subtracting the minimum peak pulling value from the maximum peak pulling value gives the peak to peak pulling value.

11. The frequency step size may be reduced at this point to more precisely identify the out of lock frequency value.

Figure 6:
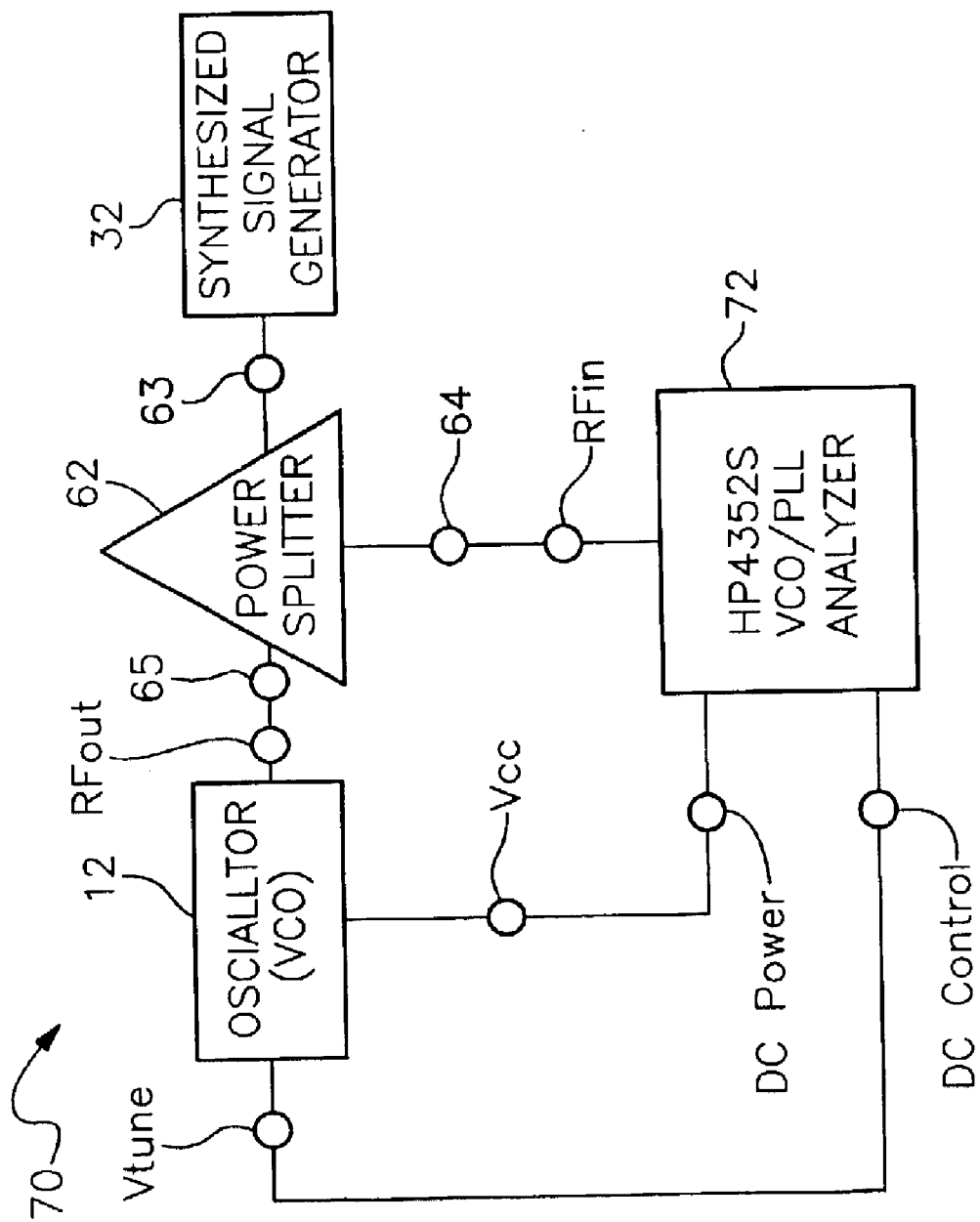
FIG. 6 is a schematic diagram of another embodiment of a test apparatus for a pulling measurement method.

Turning to FIG. 6, a schematic diagram of another test apparatus 70 for a pulling measurement method is shown. Apparatus 70 has a symmetrical resistive power splitter 62 having terminals 63, 64 and 65. An oscillator 12 has a tuning voltage terminal Vtune, an RF output terminal RF out and a supply voltage terminal Vcc. The RF output terminal RF out is connected to terminal 65. A Hewlett Packard model 4352S voltage controlled oscillator and phase locked loop analyzer (VCO/PLL) 72 has a control voltage terminal DC control, an RF input terminal RF in and a power terminal DC power. The control voltage terminal DC control is connected to the tuning voltage terminal Vtune. The power terminal DC power is connected to the supply voltage terminal Vcc and the RF input terminal RF in is connected to the terminal 64. A synthesized signal generator 32 is connected to terminal 63.

The procedure to perform the frequency pulling measurement using the test apparatus 70 of FIG. 6 is detailed in the following steps:

1. The desired Vcc and Vtune voltages are set on VCO/PLL analyzer 72, the synthesized signal generator RF power is kept off.

2. The RF power from oscillator under test 12 going to the VCO/PLL analyzer 72 is measured.

3. Oscillator 12 is turned off and the synthesized signal generator 32 is turned on.

4. The synthesized signal generator 32 power level, measured by the VCO/PLL analyzer 72, is set 6 dB less than the power level measured in step 2. This provides a −12 dBc level of synthesized signal at the output of the oscillator under test.

5. The synthesized signal generator 32 frequency is set to the nominal oscillator frequency under test (Fdut).

6. The Vtune (DC control) range is set to Vstart=max (0, Vtune−2(Fpulling/Sensitivity)) and Vstop=min (Vtune max+2, Vtune+2(Fpulling/Sensitivity)), where Fpulling is the expected peak to peak pulling value. Sensitivity is the current frequency sensitivity of the oscillator. If the expected pulling value is not known, it may be set to 10% of the carrier frequency of the oscillator.

7. The number of sampling points of the VCO/PLL analyzer 72 is set to 801.

8. The Vtune voltage is swept while observing the sensitivity characteristics of the oscillator under test 12. The oscillator tuning sensitivity should change from the normal free running value to almost zero, remain close to zero during some range of the Vtune voltage (injection lock state range) and then return back to the free running value again.

9. The multiplication of the average value of the free running tuning sensitivity by the injection lock Vtune range with be the peak to peak pulling value.

There is another locking indicator that can be used for both a non-voltage controlled oscillator and a voltage controlled oscillator. In the locked state, the phase noise of the oscillator under test will follow the phase noise of the injecting synthesized signal generator. The phase noise of the synthesized signal generator is normally much better than the phase noise of the free running unlocked oscillator at low offset values (1 to 100 KHz). The phase noise of the locked oscillator under test would be improved compared to the unlocked oscillator under test by 20 to 40 dBc/Hz. This allows the switching from locked to unlocked state to be readily detected.

The steps for this method would be:

1. injecting a normalized signal to the oscillator from a synthesized signal generator.

2. measuring phase noise of the oscillator.

3. sweeping the normalized signal from a first frequency to a second frequency while monitoring the phase noise.

4. recording the first and second frequencies where the phase noise has a large sudden change (improvement).

5. subtracting the first frequency from the second frequency to obtain a peak to peak pulling value.

The present invention has several advantages. The test method is able to cover a wide carrier frequency range. The frequency range is only limited by the frequency range of the test equipment. For FIG. 6, this is the frequency range of the VCO/PLL analyzer. Typically, the test method can cover carrier frequencies from a few Megahertz to a few Gigahertz. The carrier frequency range can be continuously covered by a single test setup without being blind to any frequencies.

The pulling measurement can be performed with good accuracy even for large impedance mismatches to the RF load. The accuracy of mismatch is limited by the power measurement of the oscillator and the synthesized signal generator and can be less than 0.5 dB. This level of mismatch accuracy is difficult to achieve with the prior art method. Various reflection coefficients or values can be synthesized using the present method. Reflection values greater than the oscillator RF output can be synthesized. This was not possible using the prior art methods.

The present method may also be used to test for the stability of the oscillation while injecting the synthesized signal through the other terminals such as the tuning voltage terminal and the supply voltage terminal.

The synthesized signals also can be injected to all of the terminals simultaneously. In this situation, the whole frequency spectrum from DC to 2 to 3 times the highest carrier frequency must be analyzed to detect spurious oscillations or the oscillation stopping.

The present test method can be easily automated and controlled by a computer program. The present test method is fast and lends itself to be used in high-speed production environments.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A test apparatus for performing a frequency pulling measurement on an oscillator comprising:
   a) a bias tee having an RF terminal, a DC terminal and an output terminal;
   b) a first power supply connected to the DC terminal;
   c) a spectrum analyzer connected to the RF terminal;
   d) an oscillator having a tuning voltage terminal, an RF output terminal and a supply voltage terminal;
   e) a second power supply connected to the tuning voltage terminal;
   f) a power splitter having a first, second and third terminal, the RF output terminal connected to the third terminal;
   g) a power meter connected to the first terminal; and
   h) a synthesized signal generator connected to the second terminal.

2. A test apparatus for performing a frequency pulling measurement on an oscillator comprising:
   a) a symmetrical resistive power splitter having a first, second and third terminal;
   b) an oscillator having a tuning voltage terminal, an RF output terminal and a supply voltage terminal, the RF output terminal connected to the first terminal;
   c) a voltage controlled oscillator and phase locked loop analyzer having a control voltage terminal, an RF input terminal and a power terminal, the control voltage terminal connected to the tuning voltage terminal, the power terminal connected to the supply voltage terminal and the RF input terminal connected to the second terminal; and
   d) a synthesized signal generator connected to the third terminal.

3. A method of performing a frequency pulling measurement comprising:
   a) providing a bias tee connected to a first power supply and a spectrum analyzer, providing an oscillator connected to a second power supply and to the bias tee and providing a power splitter connected to the oscillator, a power meter and a synthesized signal generator;
   b) setting a first and second power supply voltages;
   c) measuring an RF power at the power meter;
   d) setting the synthesized signal generator power level to a first level.
   e) setting the synthesized signal generator frequency to a nominal oscillator frequency under test;
   f) setting the spectrum analyzer frequency range to a first range and sweeping the synthesized signal generator frequency from a first frequency to a second frequency;
   g) detecting a signal above a first noise level that is indicative of the oscillator under test going out of frequency lock and recording the synthesized signal generator frequency as a first pulling frequency;
   h) sweeping the synthesized signal generator frequency from a first frequency to a third frequency;
   i) detecting a signal above the first noise level that is indicative of the oscillator under test going out of frequency lock and recording the synthesized signal generator frequency as a second pulling frequency; and
   j) calculating the difference between the first and second pulling frequencies of the synthesized signal generator when the oscillator goes out of frequency lock, the difference being a peak to peak pulling value.

4. A method for performing a frequency pulling measurement on an oscillator comprising:
   a) providing a two way power splitter connected to a synthesized signal generator and to an oscillator, providing a voltage controlled oscillator phase locked loop analyzer connected to the power splitter and the oscillator;
   b) setting a voltage at a tuning voltage terminal and a supply voltage terminal on the voltage controlled oscillator phase locked loop analyzer;
   c) measuring the RF power on the voltage controlled oscillator phase locked loop analyzer;
   d) setting the synthesized signal generator power level to a first level
   e) setting the synthesized signal generator frequency to a nominal oscillator frequency under test;
   f) setting the tuning voltage range to a first range;
   g) sweeping the tuning voltage through the first range;
   h) detecting a change in an oscillator tuning sensitivity toward zero;
   i) recording a tuning range at which the oscillator tuning sensitivity changes toward zero as a first tuning range; and
   j) multiplying an average tuning sensitivity of the free running oscillator by the first tuning range to give a peak to peak pulling value.

5. A method for performing a frequency pulling measurement on an oscillator comprising:
   a) injecting a normalized signal to the oscillator from a synthesized signal generator;
   b) sweeping the frequency of the synthesized signal generator down from a nominal frequency of the oscillator until the oscillator goes out of lock at a first frequency;
   c) sweeping the frequency of the synthesized signal generator up from a nominal frequency of the oscillator until the oscillator goes out of lock at a second frequency; and
   d) subtracting the first frequency from the second frequency to obtain a peak to peak pulling value.

6. A method for performing a frequency pulling measurement on an oscillator comprising:
   a) injecting a normalized signal to the oscillator from a synthesized signal generator;
   b) measuring phase noise of the oscillator;
   c) sweeping the normalized signal from the synthesized signal generator from a first frequency to a second frequency while monitoring the phase noise;
   d) recording the first and second frequencies of the synthesized signal generator where the phase noise has a large improvement; and
   e) subtracting the first frequency from the second frequency to obtain a peak to peak pulling value.

* * * * *